United States Patent
Pahl et al.

(10) Patent No.: US 8,865,499 B2
(45) Date of Patent: Oct. 21, 2014

(54) MEMS MICROPHONE AND METHOD FOR PRODUCING THE MEMS MICROPHONE

(75) Inventors: Wolfgang Pahl, Munich (DE); Hans Krueger, Munich (DE); Gregor Feiertag, Munich (DE); Alois Stelzl, Munich (DE); Anton Leidl, Hohenbrunn (DE); Stefan Seitz, Windach (DE)

(73) Assignee: Epcos AG, Munich (DE)

( * ) Notice: Subject to any disclaimer, the term of this patent is extended or adjusted under 35 U.S.C. 154(b) by 42 days.

(21) Appl. No.: 13/805,630

(22) PCT Filed: Jul. 7, 2011

(86) PCT No.: PCT/EP2011/061494
§ 371 (c)(1),
(2), (4) Date: Feb. 13, 2013

(87) PCT Pub. No.: WO2012/004339
PCT Pub. Date: Jan. 12, 2012

(65) Prior Publication Data
US 2013/0140656 A1    Jun. 6, 2013

(30) Foreign Application Priority Data

Jul. 8, 2010  (DE) .......................... 10 2010 026 519
Feb. 24, 2011  (DE) .......................... 10 2011 012 295

(51) Int. Cl.
*H01L 21/00*    (2006.01)

(52) U.S. Cl.
USPC ...................... 438/51; 257/416; 257/E21.522

(58) Field of Classification Search
CPC ................. H01L 29/55; H01L 29/84
USPC .............. 438/51; 257/416, E21.522; 381/332
See application file for complete search history.

(56) References Cited

U.S. PATENT DOCUMENTS

| 4,202,348 | A | * | 5/1980 | Abe et al. ................. 600/493 |
| 4,321,432 | A | | 3/1982 | Matsutani et al. ........ 179/111 R |
| 2007/0205492 | A1 | | 9/2007 | Wang ............................ 257/659 |
| 2008/0217766 | A1 | * | 9/2008 | Minervini ................... 257/723 |
| 2009/0001553 | A1 | | 1/2009 | Pahl et al. ................... 257/704 |

(Continued)

FOREIGN PATENT DOCUMENTS

| DE | 103 03 263 A1 | 8/2004 | ............... B81B 7/00 |
| DE | 10 2004 011 148 B3 | 11/2005 | ............. H04R 19/04 |

(Continued)

OTHER PUBLICATIONS

Abstract of Murayama (JP 2009-044344 A), (Feb. 26, 2009) 1 page.*

(Continued)

*Primary Examiner* — Caridad Everhart
(74) *Attorney, Agent, or Firm* — Nixon Peabody LLP (57) ABSTRACT

The invention relates to a method for producing a microphone, in which a transducer element (WE) is mounted on a carrier (TR); a cover is arranged over the transducer element (WE) and the carrier (TR) such that the transducer element (WE) is enclosed between the cover and the carrier (TR); a first sound inlet opening (S01) is produced in the carrier (TR); a functional test of the microphone is carried out; the first sound inlet opening (S01) is closed; and a second sound inlet opening (S02) is created in the cover. The present invention further relates to a microphone resulting from the method, in which the first sound inlet opening (S01) is prepared but closed.

20 Claims, 6 Drawing Sheets

(56) References Cited

U.S. PATENT DOCUMENTS

| | | | |
|---|---|---|---|
| 2009/0046436 A1* | 2/2009 | Yang et al. | 361/748 |
| 2009/0232336 A1 | 9/2009 | Pahl | 381/175 |
| 2011/0261986 A1* | 10/2011 | Murayama | 381/332 |
| 2012/0050958 A1* | 3/2012 | Sanford et al. | 361/679.01 |

FOREIGN PATENT DOCUMENTS

| | | | | |
|---|---|---|---|---|
| DE | 10 2005 053 765 A1 | 5/2007 | | B81B 7/02 |
| DE | 10 2006 046 292 A1 | 4/2008 | | |
| JP | 2009-044344 A | * | 2/2009 | H04R 1/00 |

OTHER PUBLICATIONS

PCT International Search Report for International Application No. PCT/EP2011/061494 mailed Sep. 5, 2011 (4 pages).

* cited by examiner

MEMS MICROPHONE AND METHOD FOR PRODUCING THE MEMS MICROPHONE

CROSS REFERENCE TO RELATED APPLICATIONS

This application is a U.S. national stage of International Application No. PCT/EP2011/061494, filed Jul. 7, 2011, which claims the benefit of Germany Patent Application No. 10 2011 012 295.8, filed Feb. 24, 2011, and German Patent Application No. 10 2010 026 519.5, filed Jul. 8, 2010, each of which are incorporated herein by reference in their entirety.

The present invention relates to a microphone wherein a transducer element is enclosed between a carrier and a cover. The transducer element can convert acoustic signals that enter through a sound entrance opening into electrical signals.

US 2009/0001553A1 discloses various possibilities for applying MEMS components (=microelectromechanical systems) on a carrier and covering them with a cap or some other cover. MEMS components which are embodied as sensors and which require a fluidic connection (e.g. for gases or liquids) of the covered interior toward the outside for the function of the component, such as microphones or pressure sensors, for example, require an opening in the carrier or in the cover.

Microphones having a sound opening situated at the bottom, that is to say provided in the carrier, are in widespread use. In this case, the MEMS chip can close the sound opening from the inside and thus use the entire housing volume as an acoustic reference volume or back volume.

The electrical contact-connection of an MEMS chip on a carrier substrate can be effected at the underside of the microphone, i.e. at that side of the MEMS chip which faces the carrier substrate. External soldering connections are then generally led to the underside of the carrier substrate by means of plated-through holes in said carrier substrate. If the sound entrance opening is also arranged at the underside of the microphone, then functional tests of the microphone can be carried out simply and effectively since an electrical and an acoustic contact to a test device can be produced from the same side, which is advantageous particularly when a multiplicity of microphones are produced on a common panel.

However, the acoustics of an MEMS microphone are often subject to requirements that demand a sound entrance opening at a different location. Particularly in the case of MEMS microphones comprising sound entrance openings at an unusual location, there is the problem that the functional tests are now significantly more complex. An electrical and an acoustic contact to a test apparatus here have to be established from two different sides. Alternatively, individual handling of the microphone in functional tests may also be necessary.

Therefore, it is an object of the present invention to specify an MEMS microphone which can have a sound entrance opening at an arbitrary location and which at the same time is simple to test.

This object is achieved by means of a microphone comprising the features of claim 1. Advantageous configurations and also a method for producing the microphone can be gathered from further claims.

A microphone is proposed which comprises a carrier, a cover, a transducer element mounted on the carrier, said transducer element being enclosed between the carrier and the cover, a first sound entrance opening, which is prepared but closed in the carrier, and a second sound entrance opening in the cover. The transducer element is embodied for example as a microphone chip, in particular as an MEMS microphone chip.

The first sound entrance opening, which is formed in the carrier, is used during production for testing the microphone. This makes possible a simple and automated test method in which electrical and acoustic contact-connection can preferably be implemented from the underside of the microphone. Afterward, the first sound entrance opening is closed and a second sound entrance opening is formed at an arbitrary location. Accordingly, the microphone according to the invention makes possible simple and automated testing and at the same time affords the possibility of arranging the second sound entrance opening at an arbitrary location, such that greater design freedom is achieved.

In one embodiment, the first sound entrance opening is closed with a plastic-containing composition. Said composition can be a polymer, which is preferably applied by a jet printing method. In a jet printing method, a liquid or viscous material is applied positionally accurately and contactlessly by means of a nozzle. The method makes it possible to "shoot" small droplets of the plastic-containing material onto the first sound entrance opening in a targeted manner and thus to close said opening.

Alternatively, the first sound entrance opening can also be closed by selective application (dispensing). In this case, thermoplastics and reaction resin compositions, if appropriate as a mixture with other materials such as fillers, are suitable.

If a suitable solderable metallization is provided in the region of the first sound entrance opening, e.g. a hole wall lining or a ring around the sound entrance opening, then a closure is also possible by applying and melting solder paste or by jet printing the molten solder. The first sound entrance opening can therefore also be closed by solderable material, such as solder paste or molten solder, for instance.

It is furthermore also possible to close the first sound entrance opening with a shaped part in the manner of a plug or sticker.

In one embodiment, provision is made of means for the electrical contact-connection of the transducer element on that side of the transducer element which faces the carrier. For this purpose, the carrier can have connection areas for connection to the transducer element on its side facing the transducer element and contact pads for connection to an external circuit environment on its side facing away from the transducer element. Furthermore, connection areas of the transducer element and the contact pads of the carrier can be electrically connected via plated-through holes through the carrier and/or the transducer element. The transducer element can be mounted on the carrier using flip-chip technology and can be contact-connected to the connection areas of the carrier by means of bumps.

However, it is also possible to fix the transducer element conventionally by means of chip adhesive and to produce the electrical connections by means of bonding wires. The cover can then consist, for example, of a cap or a lid.

In one embodiment, the microphone comprises at least one further component, wherein the further component is likewise covered by the cover. The further component can be a further chip, in particular an ASIC chip. Alternatively, the transducer element and the ASIC chip can be combined to form a common component on a single chip.

In one embodiment, a cavity is in each case formed in the transducer element and in the further component. The two cavities can be connected to one another by means of a channel or in some other way. The cavity in the transducer element is preferably the back volume of the transducer element. By connecting said back volume to a further cavity formed in the ASIC chip, the back volume of the transducer element is enlarged and the sensitivity of the microphone is thus improved.

In one embodiment, the transducer element and the further component are formed from two wafers, which each have cutouts on one of their flat sides and the flat sides of which are combined in such a way that the cutouts in the case of combined wafers together form a cavity. In this case, one of the two wafers can be produced as a pressed-glass or injection-molded wafer in a hot embossing or injection molding method. The cutouts of the two wafers can be exactly adapted to one another. Combining two wafers allows the process times for introducing the cavities to be reduced and, furthermore, the wall thicknesses to be minimized.

In one embodiment, the cover of the microphone comprises a covering film and at least one metallization layer.

In a method for producing the microphone, a transducer element is mounted on a carrier. A cover is subsequently arranged over the transducer element and the carrier such that the transducer element is enclosed between cover and carrier. A first sound entrance opening is provided beforehand in the carrier or is produced subsequently after the cover has been fitted. A functional test of the microphone is then carried out. Afterward, the first sound entrance opening is closed and a second sound entrance opening is produced in the cover. In this case, the closing of the first sound entrance opening and the production of the second sound entrance opening can be effected in any desired order.

The first sound entrance opening is closed by a plastic-containing composition. This can consist of, in particular, a polymer or a polymer-containing material which is applied to the first sound entrance opening by a jet printing method and which can furthermore be cured as required by exposure and/or thermally. A molten thermoplastic can also be injected into the first sound entrance opening, said thermoplastic solidifying or curing in the course of cooling.

A jet printing method is a method for the targeted contactless application of a liquid or viscous material. It makes it possible to, shoot, small droplets of the plastic-containing material onto the first sound entrance opening in a targeted manner.

Furthermore, a sealing structure can be applied to the cover all around the second sound entrance opening. The sealing structure is fixedly connected to the cover and thus to the microphone. It can be produced by patterning of a polymer layer, for example of a photoresist layer, by printing or alternatively by adhesive bonding or other fixing of a prefabricated sealing structure.

With the aid of the sealing structure present on the cover, it is possible, in a simple manner, to incorporate the microphone into an arbitrary device comprising a further sound entrance opening such that the housing interior is tightly closed with the aid of the microphone seated above the further sound entrance opening by means of the sealing structure, but the sound can penetrate in an unimpeded manner through the concentrically arranged second and further sound entrance openings as far as the transducer element.

In particular, it is possible to integrate the production of the sealing structure into the microphone manufacturing process. In this way, the sealing structure can be manufactured with minimal dimensions and exactly at the desired location of the microphone. Nevertheless, the microphone can be securely mounted in the housing and can be mounted with an accurate fit relative to the second sound entrance opening in the housing of the electrical device.

In accordance with one embodiment, the sealing structure comprises an elastomer. This is advantageous for the sealing function of the sealing structure, that is to say for sealing between microphone and housing of the electrical device, since the elastomer can also compensate for unevenesses of the housing interior all around the second sound entrance opening. An elastomer also makes it possible, in the case where the arrangement of the microphone and device housing is not 100% plane-parallel, nevertheless to produce the required impermeability.

In accordance with a further embodiment, the sealing structure has a foamed structure. The air bubbles integrated in the foamed structure, which are preferably under a slight excess pressure, also provide for a compressibility and elasticity of the sealing structure, which therefore have the same advantages as an elastomer structure.

Both elastomer and foamed structure are preferably realized with an organic plastic composition. Very soft thermoplastics or thermosetting plastics can also be suitable. Particularly suitable materials are, for example, rubber (e.g. chloroprene or acrylonitrile-butadiene rubber), polyurethane or silicone, which can be produced in a compact structure as elastomer or else in a foamed structure and thus in a particularly compressible version. Sealing structures composed of foamed plastics are also designated as FIPG (Foamed-In-Place Gasket).

It is possible to produce the sealing structure directly on the microphone, that is to say on the cover. For this purpose, the sealing structure can be applied or administered dropwise in the form of a viscous liquid by means of a dispenser.

It is also possible to apply the sealing structure by printing, for example by means of screen, stencil or stamp printing.

After application, the sealing structure applied as a viscous composition can be cured or it cures actively, for example at an elevated temperature or under the action of UV radiation.

A sealing structure produced from thermoplastic can also be applied in the molten state and cured by cooling.

The sealing structure can also be prefabricated in solid form and subsequently be mounted, and in particular adhesively bonded, onto the MEMS microphone all around the first sound entrance opening. A prefabricated seal can also cover the second sound entrance opening if it is acoustically transmissive or is made acoustically transmissive in this region. For this purpose, it can have a porous structure, for example. It is also possible for one or more holes to be produced subsequently. Subsequently opening the sound entrance opening may be advantageous during the microphone production processing method in order to protect the interior of the microphone, e.g. sensitive parts of the transducer element and in particular of the MEMS chip, against specific processing steps.

The form of the sealing structure can be chosen or fashioned depending on the form of the respective sound entrance opening. It preferably has a structure closed in a ring- or frame-shaped manner, wherein it can assume any desired contour line.

A sealing structure can also be provided around the first sound entrance opening, which sealing structure can be embodied in the same way as the sealing structure around the second sound entrance opening.

The invention is explained in greater detail below on the basis of exemplary embodiments and with reference to the associated figures. In this case, the figures are depicted only schematically and not true to scale, and so neither absolute nor relative dimensional indications can be inferred from the figures.

Figure 1A:
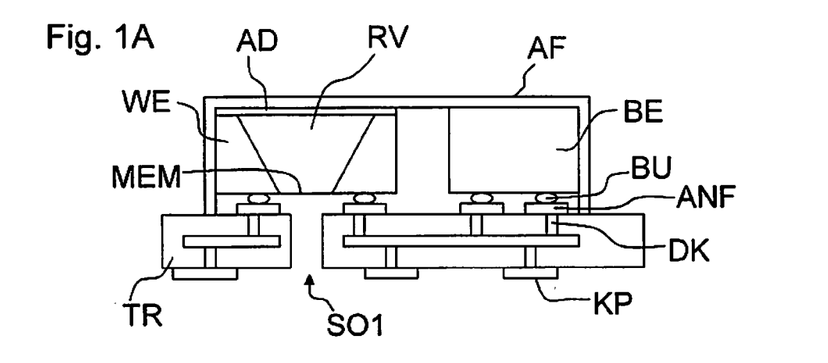
FIGS. 1A to 1E show various method stages during the production of an MEMS microphone comprising two sound entrance openings.

FIGS. 1A to 1E show various method stages of the production of an MEMS microphone. FIG. 1A shows an MEMS microphone after a transducer element WE and a further component BE have been mounted on a carrier TR. The transducer element WE has a membrane MEM and a back volume RV. The back volume RV is delimited by a first cover AD, which is applied at the wafer level and in this case, for example, covers a cutout in the transducer element and tightly encloses the volume of said cutout such that it can be utilized as a back volume. The first cover AD is a film, for example. A sound entrance opening SO1 is arranged in the carrier TR.

The cover can also be a rigid cap which, after being placed onto the carrier, encloses a cavity under itself, in which the microphone chip and, if appropriate, further components assigned to the microphone and the function thereof can be arranged. Such a component can be an ASIC (Application Specific Integrated Circuit), for example, which performs e.g. amplification or digitization functions for the microphone and generates a corresponding amplified and/or digitized output. The cap can then be formed from metal, ceramic, plastic or arbitrary combinations of these materials. The entire free volume enclosed below the cap can act as a back volume.

The cover can also follow the contours of transducer element or microphone chip and, if appropriate, ASIC and can be laminated, for example, as a covering film AF over the entire transducer element and at least in part also onto the carrier. It is then applied above the two chips WE, BE in such a way that it terminates with the carrier TR and effects sealing laterally all around transducer element and ASIC chip or further component. A cover suitable for this purpose therefore consists e.g. of a laminatable film which is a thermoplastic film, a B-stage film, or a composite film, which can comprise one or a plurality of different partial layers composed of plastic and, if appropriate, a metal film integrated as a partial layer therein.

A particularly tight cover is obtained if such a laminated covering film AF is provided with a metallic coating on the exterior in a later step. Such a coating can be applied for example by means of vapor deposition, plasma or sputtering methods and can be reinforced galvanically or in electroless fashion. With the correspondingly thick metallic coating, a housing that is mechanically sufficiently stable can be produced even with an originally thin laminated covering film.

The transducer element WE is electrically contact-connected to the carrier TR here by means of bumps BU. The carrier TR has connection areas ANF on its side facing the transducer element WE. On the side facing away from the transducer element WE, the carrier TR has contact pads KP. The contact pads KP and the connection areas ANF are connected to one another via plated-through holes DK.

Accordingly, the electrical contact-connections and the acoustic access of the microphone are now situated on the underside of the carrier TR. Functional tests can now be carried out simply and in an automated manner.

The further component (BE) is also mounted on the carrier by means of bumps (BU) using flip-chip technology.

Figure 1B:
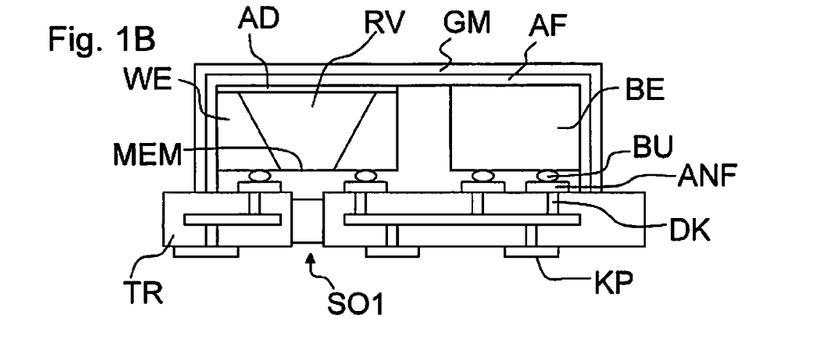

FIG. 1B: after the functional tests by introducing sound through the first sound entrance opening SO1, the first sound entrance opening SO1 in the carrier TR is closed. For this purpose, a polymer is applied in the first sound entrance opening SO1 by means of a jet printing method. The polymer is subsequently cured, e.g. by exposure and/or thermally.

Afterward, in order to produce the metallization already indicated further above on the covering film AF a base metallization GM is applied over the whole area, for example by means of a plasma deposition or by means of sputtering. For this purpose, use is made of a metal such as e.g. Ti or a mixture or a layer sequence of metals which firstly ensure good adhesion on the covering film AF and secondly are well suited as a growth layer for the later galvanical reinforcement of the base metallization GM.

Alternatively, the base metallization GM can be applied on the covering film AF over the whole area before the first sound entrance opening SO1 is closed in the carrier TR, as described above.

Figure 1C:
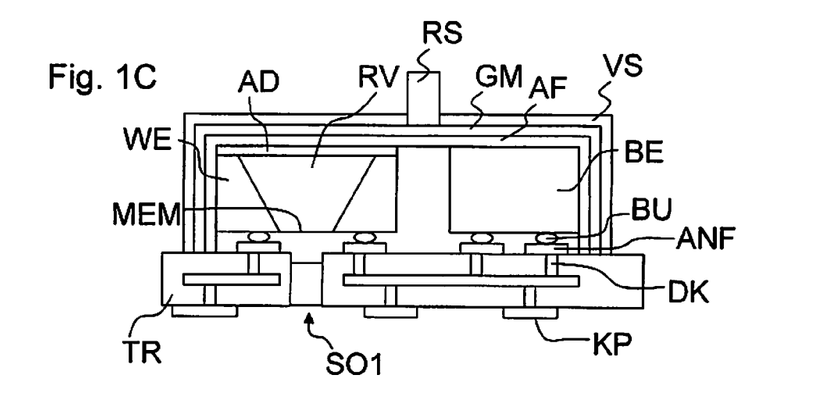

FIG. 1C shows the MEMS microphone after the next step. The base metallization GM is galvanically reinforced. Preferably, the reinforcement is performed such that a second sound entrance opening SO2 is preformed or an area provided for a second sound entrance opening SO2 is excluded from the galvanical reinforcement. For this purpose, it is possible to produce a resist structure RS as a local cover in the region of the later second sound entrance opening SO2 on the base metallization GM, for example by patterning a photoresist layer.

Figure 1D:
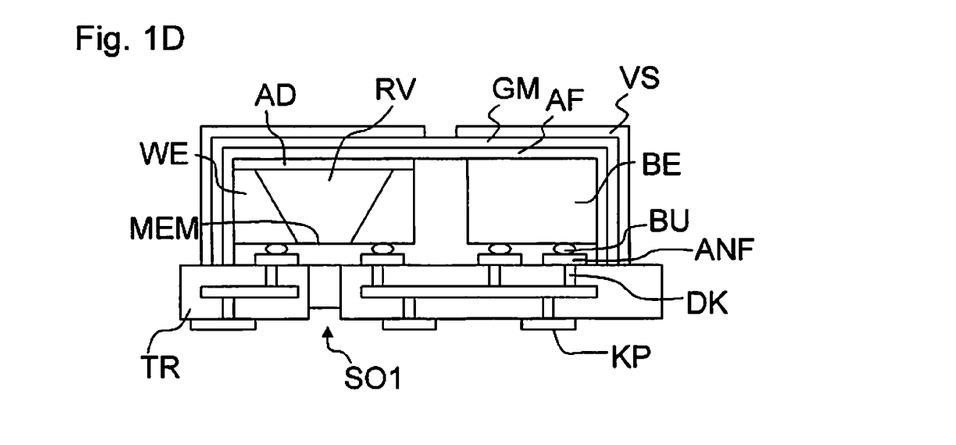

The galvanical reinforcement of the base metallization GM can be effected for example by galvanical deposition of copper as a conductive layer and a further layer as anticorrosion protective layer, wherein the conductive layer and the further layer together form a reinforcer layer VS. By way of example, approximately 50 µm of CU and a few µm of nickel are successively produced galvanically above the base metallization GM. FIG. 1D shows the arrangement after the galvanical deposition of the reinforcer layer VS and after the removal of the resist structure RS. An opening in the reinforcer layer VS, after the removal of the resist structure RS, is situated where the resist structure RS prevented galvanical reinforcement of the base metallization GM.

Figure 1E:
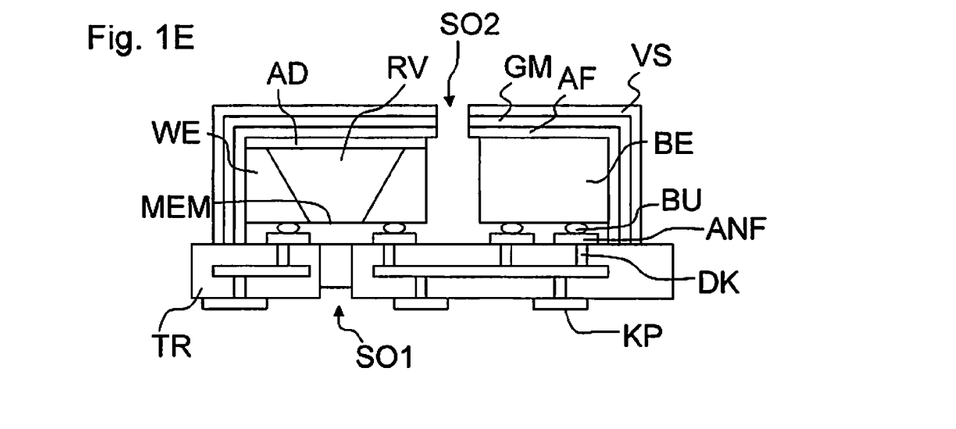

FIG. 1E shows the MEMS microphone after the production thereof. A complete perforation of the cover for producing the second sound entrance opening SO2 is now accomplished by laser drilling, for example. Since only a relatively thin metal layer, the base metallization GM, and a covering film AF preferably consisting of plastic need be perforated, this is accomplished with relatively low intensities and in a controlled manner, such that damage to components of the MEMS microphone that are located below the second sound entrance opening SO2, or to the surface of the carrier of the MEMS microphone, can be successfully prevented. By way of example, $CO_2$, YAG or UV lasers are suitable for opening the base metallization GM in the region of the second sound entrance opening SO2.

In one variant of the method, the resist structure RS can also be applied by printing, for example by means of a jet printing method. The resist structure RS is preferably produced in a lateral extent corresponding to at least double the thickness of the later reinforcement layer VS. This prevents the resist structure RS from being overgrown during the galvanical deposition. After the base metallization GM has been perforated, the covering film AF can be processed with lower laser intensities in order to completely open the second sound entrance opening SO2 or to lead through all layers of the cover. The resist structure need not be removed in this case; it can also be drilled through together with the underlying layers.

Alternatively, the resist structure RS can be dispensed with. If an end point detection—e.g. by plasma spectral analysis—is used for instance during a laser drilling process, then the second sound entrance opening can be drilled through the full metallization thickness, without impermissible damage to underlying parts having to be accepted.

Furthermore, the housing process can also be effected differently, in principle, for instance by fixing a preshaped cap or a lid above the chip. Crucial factors include the configuration of the first sound entrance opening SO1 on the component contact side of the carrier, the reclosure of the first sound entrance opening SO1 and the production of the second sound entrance opening SO2 after the functional test.

Figure 1F:
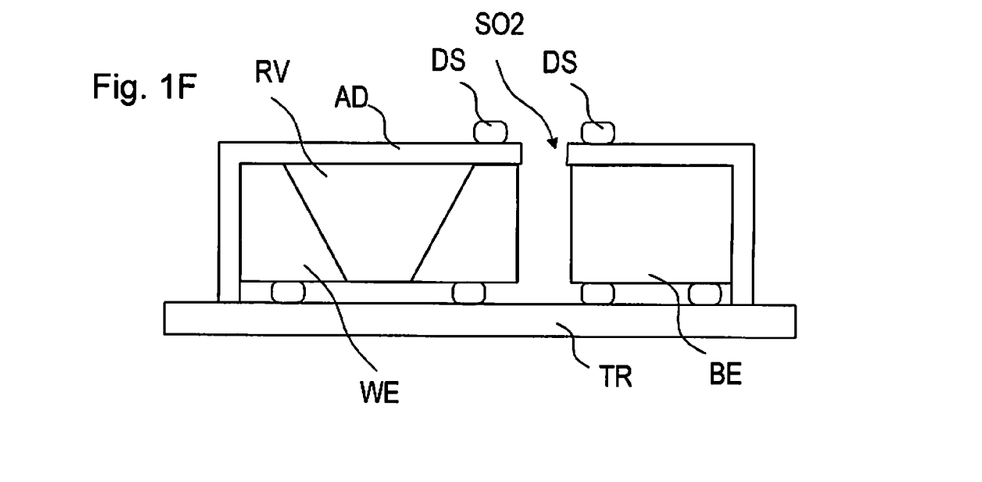
FIG. 1F shows a microphone comprising a sealing structure around the sound entrance opening.

FIG. 1F shows an embodiment of an MEMS microphone in which the cavity in the transducer element is closed by a cover AD and thus encloses a back volume between membrane and cover AD which is substantially defined by the size of the perforation in the transducer element WE. The cover AD can comprise a first cover directly above the back volume, a covering film and, if appropriate, a metallic reinforcement layer.

In this embodiment, the second sound entrance opening SO2 constitutes an access to the membrane of the MEMS transducer element WE and is arranged here exactly above the gap between transducer element and further chip (e.g. ASIC). A sealing structure DS is arranged all around the second sound entrance opening SO2 above the gap between the two chips. The cover AD can be a conformally bearing cover. However, it is also possible to use a rigid cover which is prefabricated and is placed onto the carrier TR such that it covers microphone chip and further component BE. The first sound entrance opening is not illustrated in this FIG. 1F.

Figure 2:
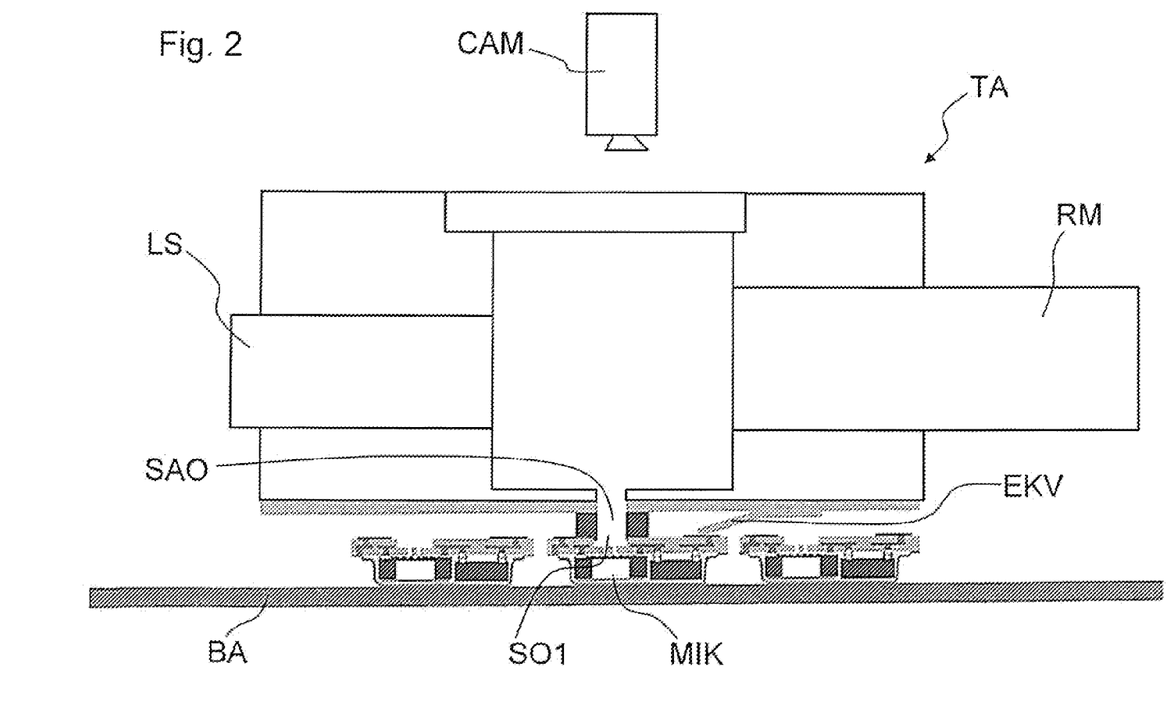
FIG. 2 shows a functional test of the MEMS microphones.

FIG. 2 shows the test method by which the manufactured MEMS microphones are tested with regard to their functionality. The microphones MIK are manufactured in parallel from a wafer and subsequently singulated into individual microphones. A test apparatus TA comprising a loudspeaker MS, a sound exit opening SAO and a reference microphone RM is used for the functional test. The test apparatus TA is aligned above the sound entrance opening SO2 of the microphone MIK to be tested in such a way that sound exit opening SAO of the test apparatus TA and sound entrance opening SO2 of the microphone MIK lie one above the other. A camera CAM can be used for fine adjustment. Test apparatus TA and microphone MIK are acoustically coupled to one another by the sound exit opening SAO and the sound entrance openings SO2.

Furthermore, the test apparatus TA comprises an electrical contact device EKV enabling electrical contact to be made with the microphone MIK. By means of a relative movement of the test apparatus TA and of the microphones MIK, arranged on a belt BA, with respect to one another, a plurality of microphones MIK can be successively tested.

Figure 3A:
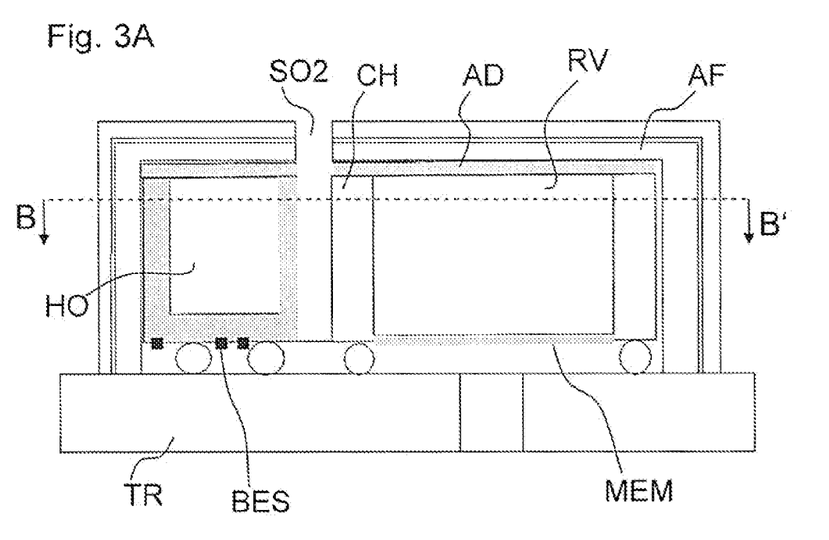
FIGS. 3A and 3B show a second exemplary embodiment of an MEMS microphone.
Figure 3B:
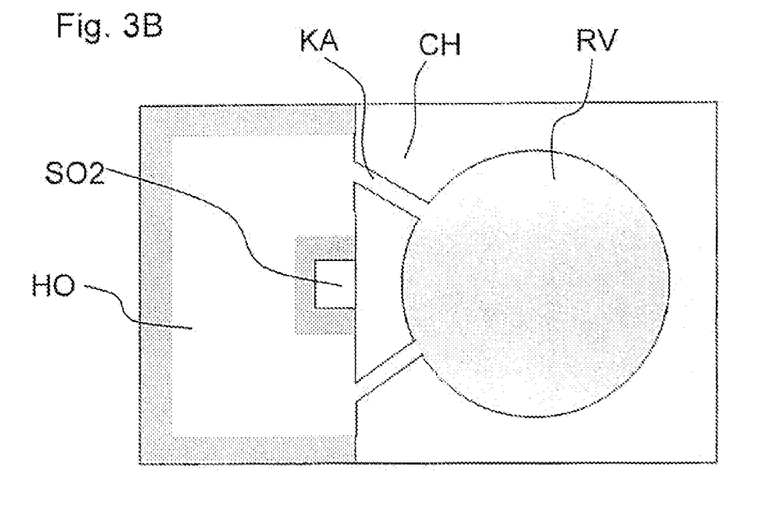

FIG. 3A and FIG. 3B schematically show a further embodiment of the microphone according to the invention. FIG. 3A shows a microphone according to the invention in a side view. FIG. 3B shows a cross section through the microphone illustrated in FIG. 3A along the line B-B'.

In the case of the microphone shown in FIGS. 3A and 3B, the transducer element WE and the further component BE are combined to form a single chip CH. The chip CH has an opening that leads into the second sound entrance opening SO2. A back volume RV is formed in the transducer element WE.

The chip CH illustrated in FIGS. 3A and 3B is produced from a wafer composed of semiconductor material, for example from a silicon wafer. Component structures BES and also a membrane MEM are structured on the underside of the chip facing the carrier TR. The component structures can be, for example, integrated circuits, in particular ASIC structures.

On the top side of the chip CH facing away from the carrier TR, cutouts RV, HO and one or more channels KA are etched using dry or wet etching methods. The cutouts and the channels are closed with a first cover AD and can be provided, on the carrier, with a further cover, the structure and application of which are described in FIGS. 1A to 1E. All steps for manufacturing the chip including the first cover can be effected at the wafer level.

After the chips have been singulated, they are mounted on the carrier and further covered with the covering film AF.

The first cover AD, which is applied at the wafer level, can be a film. The latter prevents the covering film AF from being able to penetrate into the back volume RV. The reproducibility of an exact back volume RV can be ensured in this way.

FIG. 3B shows a cross section through the microphone illustrated in FIG. 3A along the line B-B'. The back volume RV of the transducer element WE is connected via the channels KA to a cavity HO formed in the further component BE. In this case, the channels KA enclose the second sound entrance opening SO2.

Figure 4A:
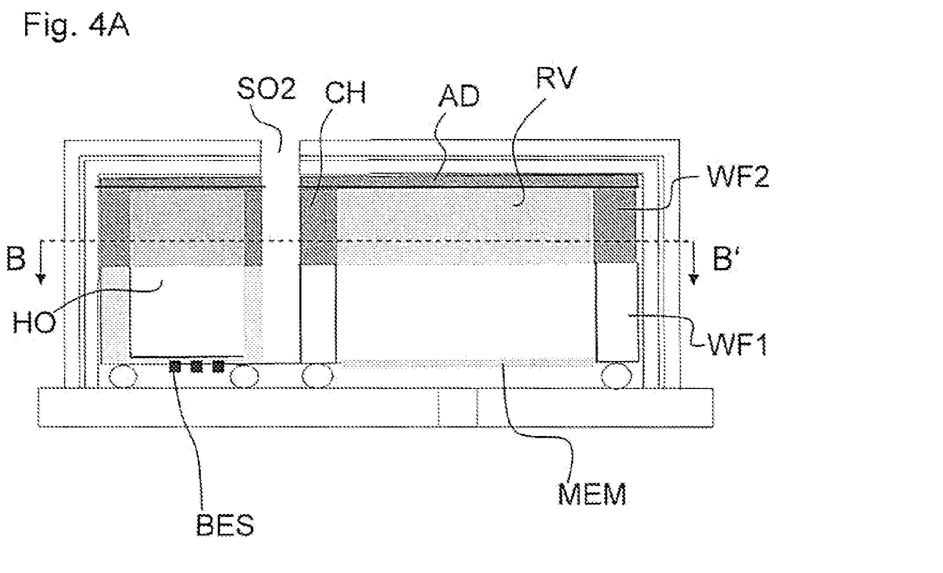
FIGS. 4A and 4B show a third exemplary embodiment of an MEMS microphone.
Figure 4B:
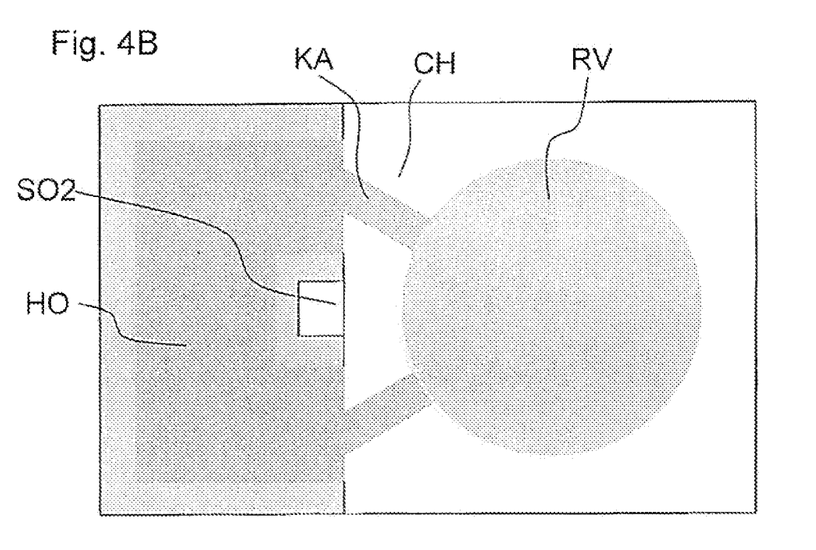

FIG. 4A and FIG. 4B schematically show a further embodiment of the microphone according to the invention. FIG. 4A shows a microphone according to the invention in a side view. FIG. 4B shows a cross section through the microphone illustrated in FIG. 4A along the line B-B'.

Here the further component BE and the transducer element WE are likewise combined to form a single chip CH. The chip CH is formed by connecting two wafers WF1, WF2, wherein each wafer WF1, WF2 has cutouts on the side facing the opposite wafer WF1, WF2. The two wafers WF1, WF2 are then combined such that their cutouts complement one another in pairs to form cavities HO. The back volume RV of the transducer element WE is once again connected via channels KA to a cavity HO in the further component BE.

The first wafer WF1 is arranged between the carrier TR and the second wafer WF2. The first wafer WF1 substantially consists of a semiconductor material, for example of silicon. Component structures BES and a membrane MEM are structured on the underside of the first wafer WF1 facing the carrier TR. Cutouts are etched in on the top side of the first wafer WF1. After the two wafers WF1, WF2 have been combined, said cutouts form part of the back volume RV, HO of the transducer element WE.

The second wafer WF2 is arranged on the top side of the first wafer WF1, i.e. on that side of the first wafer WF1 which faces away from the carrier TR. The second wafer WF2 can substantially consist of a plastic or of glass. It can be shaped in a die-casting, injection-molding or hot-embossing method. In this case, cutouts are structured on the underside of the second wafer, i.e. on the side facing the first wafer WF1. If the first and second wafers WF1, WF2 are combined at their flat sides with the joining areas, then the cutouts in the first and second wafers form cavities HO, RV which serve as a back volume of the transducer element WE.

Furthermore, channels KA are structured in the joining area of at least one of the wafers WF1, WF2, said channels connecting the cavities to one another when the wafers WF1, WF2 are combined.

Besides manufacturing the microphone at the wafer level it is also possible, of course, firstly to connect the two wafers, to singulate the microphones and then to mount them onto the carrier. It is likewise possible to mount chips singulated from the first wafer and only afterward to connect them to a second chip and cover them. The covering of first and second chips e.g. by means of a covering film applied above the chip (first and second chips) is effected on the carrier in all cases.

It is evident that with the described arrangement of transducer element WE, further component BE and second sound opening SO2 it is possible to achieve an acoustic performance of the microphone which corresponds to that of an identical microphone having a sound opening toward the bottom.

Figure 5:
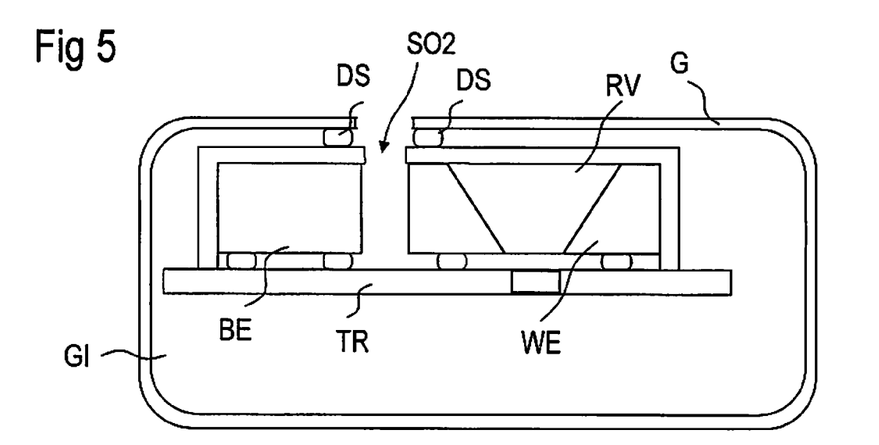
FIG. 5 shows an MEMS microphone after incorporation into the housing G (only illustrated schematically) of an electrical device.

FIG. 5 shows an MEMS microphone after incorporation into the housing G (only illustrated schematically) of an electrical device, e.g. the housing of a mobile radio device. It is evident that the MEMS microphone, by means of a sealing structure DS fixed around the second sound entrance opening SO2 on the cover AD of the MEMS microphone, can seal the two sound entrance openings in housing and MEMS microphone toward the inside or toward the housing interior. In this way, the housing interior GI, in which further sensitive electrical or electronic components or devices are arranged, is protected against the environmental influences outside the housing G.

LIST OF REFERENCE SIGNS

WE Transducer element
BE Further component
TR Carrier
MEM Membrane
RV Back volume
SO1 First sound entrance opening
AF Covering film
BU Bump
ANF Connection area
KP Contact pad
DK Plated-through hole
GM Base metallization
SO2 Second sound entrance opening
RS Resist structure
VS Reinforcer layer
MIK Microphone
TA Test apparatus
LS Loudspeaker
SAO Sound exit opening
RM Reference microphone
CAM Camera
EKV Electrical contact device
BA Belt
CH Chip
KA Channel
HO Cavity
WF1, WF2 First and second wafer, respectively
BES Component structures
AD First cover
G Housing
GI Housing interior

The invention claimed is:

1. A microphone, comprising:
a carrier;
a transducer element mounted on the carrier;
a cover, wherein the transducer element is enclosed between the carrier and the cover;
a first sound entrance opening in the carrier, the first sound entrance opening is prepared but closed by a material;
a second sound entrance opening in the cover; wherein the carrier has connection areas on a side facing the transducer element, contact pads on a side facing away from the transducer element and plated-through holes which electrically contact-connect the connection areas to the contact pads; and
wherein the transducer element is mounted on the carrier using flip-chip technology and is contact-connected to the connection areas by bumps or bonding wires.

2. The microphone according to claim 1, wherein the material is a plastic-containing composition.

3. The microphone according to claim 1, wherein the material is solder.

4. The microphone according to claim 1, wherein a sealing structure is applied to the cover around the second sound entrance opening.

5. The microphone according to claim 1, wherein the transducer element is electrically contact-connected to the carrier by bonding wires.

6. The microphone according to claim 1, wherein the cover comprises a covering film and a metallization layer.

7. The microphone according to claim 1, wherein at least one further component is applied on at least one of the carrier or the transducer element, wherein the component is arranged below the cover.

8. The microphone according to claim 7, wherein respective cavities are formed in the transducer element and in the further component, and the two cavities are connected to one another by a channel.

9. The microphone according to claim 7, wherein the transducer element and the further component are formed in two wafers, each wafer has a cutout on a flat side, and wherein the flat sides are combined in the microphone in such a way that the cutouts together form a connected cavity.

10. A method for producing a microphone, comprising:
mounting a transducer element on a carrier, wherein the carrier has connection areas on a side facing the transducer element, contact pads on a side facing away from the transducer element and plated-through holes which electrically contact-connect the connection areas to the contact pads, and wherein the transducer element is mounted on the carrier using flip-chip technology and is contact-connected to the connection areas by bumps;
arranging a cover above the transducer element and the carrier such that the transducer element is enclosed between the cover and the carrier;
producing a first sound entrance opening;
conducting a functional test of the microphone;
closing the first sound entrance opening; and
producing a second sound entrance opening in the cover.

11. The method according to claim 10, further including mounting, before the cover is applied, a further component on the carrier.

12. The method according to claim 10, wherein the second sound entrance opening is produced by a laser drilling method.

13. The method according to claim 10, wherein the first sound entrance opening is closed by one of a group consisting of a plastic-containing composition or by solder.

14. The method according to claim 13, wherein the closing of the first sound entrance opening includes jet-printing the plastic-containing material to the first sound entrance opening curing the plastic-containing material.

15. The method according to claim 10, further including laminating a film over the transducer element onto the carrier.

16. The method according to claim 15, further including applying a metallization layer above the film.

17. The method according to claim 16,
wherein the metallization layer comprises a base metallization and a reinforcer layer, wherein the base metallization is applied to the cover over the whole area, and wherein the reinforcer layer is applied by metal deposition such that deposition of the reinforcer layer is prevented in the region of the second sound entrance opening, the producing of the second sound opening occurring after the applying of the metallization layer.

18. The method according to claim 17, wherein a resist structure is applied in the region of the second sound entrance opening, said resist structure preventing deposition of the reinforcer layer in said region, the producing of the second sound opening occurring after the applying of the resist structure.

19. A microphone, comprising:
a carrier;
a cover positioned generally over the carrier;
a transducer element mounted on the carrier, the transducer element is located between the carrier and the cover, wherein the transducer element is electrically contact-connected to the carrier by bonding wires;
a test opening in the carrier, the test opening permitting testing of the microphone prior to an operational state;
material attached to the carrier and closing the test opening after the testing; and
a sound opening in the cover for receiving sound in the operational state.

20. A method for producing a microphone, comprising:
mounting a transducer element on a carrier, wherein the transducer element is electrically contact-connected to the carrier by bonding wires;
arranging a cover above the transducer element and the carrier such that the transducer element is enclosed between the cover and the carrier;
producing a first sound entrance opening in the carrier;
conducting a functional test of the microphone;
closing the first sound entrance opening; and
producing a second sound entrance opening in the cover.

* * * * *